(12) United States Patent
Buckley, Jr.

(10) Patent No.: US 8,156,395 B2
(45) Date of Patent: Apr. 10, 2012

(54) METHODS FOR GENERATING TEST PATTERNS FOR SEQUENTIAL CIRCUITS

(75) Inventor: Delmas R. Buckley, Jr., Livermore, CA (US)

(73) Assignee: Yardstick Research, LLC, Livermore, CA (US)

( * ) Notice: Subject to any disclaimer, the term of this patent is extended or adjusted under 35 U.S.C. 154(b) by 456 days.

(21) Appl. No.: 12/509,553

(22) Filed: Jul. 27, 2009

(65) Prior Publication Data

US 2010/0023824 A1   Jan. 28, 2010

Related U.S. Application Data

(60) Provisional application No. 61/084,231, filed on Jul. 28, 2008.

(51) Int. Cl.
*G01R 31/28* (2006.01)
*G06F 11/00* (2006.01)

(52) U.S. Cl. .................... 714/738; 714/741
(58) Field of Classification Search .................. 714/738, 714/724, 726, 723, 3, 725, 741, 25
See application file for complete search history.

(56) References Cited

U.S. PATENT DOCUMENTS

| | | | |
|---|---|---|---|
| 5,377,197 A | 12/1994 | Patel et al. | |
| 5,430,736 A | 7/1995 | Takeoka et al. | |
| 5,502,729 A | 3/1996 | Nakata | |
| 5,588,008 A | 12/1996 | Nakata | |
| 5,590,135 A | 12/1996 | Abramovici et al. | |
| 5,831,996 A | 11/1998 | Abramovici et al. | |
| 5,910,958 A | 6/1999 | Jay et al. | |
| 5,933,633 A | 8/1999 | Good et al. | |
| 5,958,077 A | 9/1999 | Banerjee et al. | |
| 6,018,813 A | 1/2000 | Chakradhar et al. | |
| 6,141,630 A | 10/2000 | McNamara et al. | |
| 6,195,776 B1 | 2/2001 | Ruiz et al. | |
| 6,205,567 B1 * | 3/2001 | Maruyama | 714/741 |
| 6,209,120 B1 | 3/2001 | Kurshan et al. | |
| 6,282,681 B1 | 8/2001 | Sun et al. | |
| 6,292,915 B1 | 9/2001 | Hosokawa et al. | |
| 6,334,200 B1 | 12/2001 | Fujiwara et al. | |
| 6,449,743 B1 | 9/2002 | Hosokawa | |
| 6,470,485 B1 | 10/2002 | Cote et al. | |
| 6,789,222 B2 | 9/2004 | Buckley, Jr. | |
| 7,017,096 B2 | 3/2006 | Abramovici et al. | |
| 2005/0166114 A1 | 7/2005 | Buckley, Jr. | |
| 2005/0240387 A1 | 10/2005 | Spadari et al. | |

OTHER PUBLICATIONS

Bergmann, J.P., et al., "Improving Coverage Analysis and Test Generation for Large Circuits," IEEE 1999.
Bertacco, V., "Achieving Scalable Hardware Verification with Symbolic Simulation," Ph.D. Dissertaion, Standford Univ., Aug. 2003, Ch. 3, pp. 43-66.
Bhatia, S., et al., "Integration of Hierarchical Test Generation with Behavioral Synthesis of Controller and Data Path Circuits," IEEE Trans. VLSI Sys., vol. 6, No. 4, Dec. 1998.
Brace, K.S., et al., "Efficient Implementation of a BDD Package," 27th ACM/IEEE Des. Auto. Conf., 1990, pp. 40-45.

(Continued)

*Primary Examiner* — Phung M Chung
(74) *Attorney, Agent, or Firm* — Robert Buckley

(57) ABSTRACT

A single-pass method for test pattern generation for sequential circuits employs a local-fault at each time-frame. The result is that a fault arriving at circuit primary output lines unambiguously signals the discovery of a valid test pattern sequence for the fault. The valid test pattern sequence is reconstructed from stored history and is used to test a sequential circuit.

20 Claims, 11 Drawing Sheets

OTHER PUBLICATIONS

Bryant, R.E., "Graph-Based Algorithms for Boolean Function Manipulation," IEEE Trans. Comp., vol. C-35, No. 8, Aug. 1986, pp. 677-691.
Bryant, R.E., "Symbolic Boolean Manipulation with Ordered Binary-Decision Diagrams," ACM Comp. Surveys, vol. 24, No. 3, Sep. 1992, pp. 292-318.
Chakravarty, S., et al., "Simulation and Generation of IDDQ Tests for Bridging Faults in Combinational Circuits," IEEE Trans. Comp., vol. 45, No. 10, Oct. 1996, pp. 1131-1140.
Chang, S-C., et al., "TAIR: Testability Analysis by Implication Reasoning," IEEE Trans. Comp-Aided Des., vol. 19, No. 1, Jan. 2000, pp. 152-160.
Cheng, K-T., "Tutorial and Survey Paper: Gate-Level Test Generation for Sequential Circuits," ACM Trans. Des. Auto. of Elec. Sys., vol. 1, No. 4, Oct. 1996, pp. 405-442.
Cheng, K-T., "Transition Fault Testing for Sequential Circuits," IEEE Trans. Comp-Aided Des., vol. 12, No. 12, Dec. 1993, pp. 1971-1983.
Cheng, K-T., et al., "Generation of High Quality Tests for Robustly Untestable Path Delay Faults," IEEE Trans. Comp., vol. 45, No. 12, Dec. 1996, pp. 1379-1392.
Cheng, K-T., et al., "Automatic Generation of Functional Vectors Using the Extended Finite State Machine Model," ACM Trans. Des. Auto., vol. 1, No. 1, Jan. 1996, pp. 57-79.
Cheng, K-T., et al., "A Functional Fault Model for Sequential Machines," IEEE Trans. Comp-Aided Des., vol. 11, No. 9, Sep. 1992, pp. 1065-1073.
Corno, F., et al., "Enhancing Topological ATPG with High-Level Information and Symbolic Techniques," Int'l Conf. Comp. Des. 1998.
Das, D.K., et al., "Isomorph-Redundancy in Sequential Circuits," IEEE Trans. Comp., vol. 49, No. 9, Sep. 2000, pp. 992-997.
Fujiwara, H., "A New Class of Sequential Circuits with Combinational Test Generation Complexity," IEEE Trans. Comp., vol. 49, No. 9, Sep. 2000, pp. 895-905.
Fummi, F., et al., "A Hierarchical Test Generation Approach for Large Controllers," IEEE Trans. Comp., vol. 49, No. 4, Apr. 2000, pp. 289-302.
Ghosh, I., et al., "Automatic Test Pattern Generation for Functional RTL Circuits Using Assignment Decision Diagrams," Des. Auto. Conf. 2000.
Giraldi, J. et al., "EST: The New Frontier in Automatic Test-Pattern Generation," 27th ACM/IEEE Des. Auto. Conf., 1990, pp. 667-672.
Hamzaoglu, I., et al., "Deterministic Test Pattern Generation Techniques for Sequential Circuits," IEEE/ACM Int'l Conf. on CAD, 2000, pp. 538-543.
Hamzaoglu, I., et al., "New Techniques for Deterministic Test Pattern Generation," Jour. Elec. Testing, vol. 15, Issue 1-2, Aug.-Oct. 1999, pp. 63-73.
Hsiao, M.S., et al., "Dynamic State Traversal for Sequential Circuit Test Generation," ACM Trans. Des. Auto. of Elec. Sys., vol. 5, No. 3, Jul. 2000, pp. 548-565.
Hsu, Y-C., et al., "A Simulator for At-Speed Robust Testing of Path Delay Faults in Combinational Circuits," IEEE Trans. Comp., vol. 45, No. 11, Nov. 1996, pp. 1312-1388.
Inoue, T., et al., "An Optimal Time Expansion Model Based on Combinational ATPG for RT Level Circuits," Proc. 7th Asian Test Symp., Dec. 1998, pp. 190-197.
Inoue, T., et al., "Test Generation for Acyclic Sequential Circuits with Hold Registers," Proc. Int'l Conf. on CAD, 2000, pp. 550-556.
Ip, C.N., "Simulation Coverage Enhancement Using Test Stimulus Transformation," Proc. Int'l Conf. on CAD, 2000, pp. 127-134.
Kocan, F., et al., "Concurrent D-Algorithm on Reconfigurable Hardware," Proc. Int'l Conf. on CAD, 1999, pp. 152-156.
Langevin, M., et al., "Behavioral Verification of an ATM Switch Fabric Using Implicit Abstract State Enumeration," Proc. 1996 Int'l Conf. Comp. Des., pp. 20-26.
Lin, X., et al., "Techniques for Improving the Efficiency of Sequential Circuit Test Generation," Proc. 1999 Int'l Conf. CAD, pp. 147-151.
Lin, X., et al., "On Finding Undetectable and Redundant Faults in Synchronous Sequential Circuits," 1998 Int'l Conf. Comp. Des.
Moundanos, D., et al., "Abstraction Techniques for Validation Coverage Analysis and Test Generation," IEEE Trans. Comp., vol. 47, No. 1, Jan. 1998, pp. 2-14.
Ochi, H., et al., "Breadth-First Manipulation of Very Large Binary-Decision Diagrams," Proc. Int'l Conf. CAD, Nov. 1993, pp. 48-55.
Pomeranz, I., et al., "Test Generation for Synchronous Sequential Circuits to Reduce Storage Requirements," 7th Asian Test Sypm., Dec. 1998, pp. 446-451.
Pomeranz, I., et al., "A Diagnostic Test Generation Procedure for Combinational Circuits Based on Test Elimination," 7th Asian Test Symp., Dec. 1998, pp. 486-491.
Psarakis, M., et al., "Sequential Fault Modeling and Test Pattern Generation for CMOS Iterative Logic Arrays," IEEE Trans. Comp., vol. 49, No. 10, Oct. 2000, pp. 1083-1099.
Raik, J., et al., "Sequential Circuit Test Generation Using Decision Diagram Models," Proc. Des. Auto. Test Europe, 1999, pp. 736-740.
Rudnick, E.M., et al., "Fast Sequential Circuit Test Generation Using High-Level and Gate-Level Techniques," Proc. Des. Auto. Test Europe, 1998, pp. 570-576.
Stephan, P., et al., "Combinational Test Generation Using Satisfiability," IEEE Trans. CAD, vol. 15, No. 9, Sep. 1996, pp. 1167-1176.
Sun, X., et al., "Functional Verification Coverage vs. Physical Stuck-at Fault Coverage," 1998 Int'l Symp. Defect Fault Tol. VLSI, pp. 108-116.
Tafertshofer, P., et al., "SAT Based ATPG Using Fast Justification and Propagation in the Implication Graph," 1999 Int'l Conf. CAD, pp. 139-146.
Tekumalla, R.C., et al., "On Primitive Fault Test Generation in Non-Scan Sequential Circuits," 1998 Int'l Conf. CAD, pp. 275-282.
Tragoudas, S., et al., "ATPG Tools for Delay Faults at the Functional Level," ACM Trans. Des. Auto. Elec. Sys., vol. 7, No. 1, Jan. 2002, pp. 33-57.
Van Der Linden, J.T., et al., "Complete Search in Test Generation for Industrial Circuits with Improved Bus-Conflict Detection," 7th Asian Test Symp., Dec. 1998, pp. 212-221.
Williams, T.W., "The New Frontier for Testing: Nano Meter Technologies," 7th Asian Test Symp., Dec. 1998, pp. 2-7.
Hsiao, M.S., et al., "Application of genetically engineered finite-state-machine sequences to sequential circuit ATPG." IEEE Transactions on Computer-Aided Design of Integrated Circuits and Systems, vol. 17, Issue 3, 1998, pp. 239-254.

* cited by examiner 5.0 Define a fault-object having format:
   <label, fault-propagation function>
502

5.1 At end of time-frame, for each fault-object arriving at a next-state line, decompose the fault-propagation function into it's component state/input vectors, *S/I*. This step can result in multiple intermediate objects of the following type:
   <label, S/I>.
504

5.2 For each intermediate-object having distinct <label, S/I>, create a pattern-object: <label, S/I, fault-pattern> having an all-zeros fault-pattern.
506

5.3 For each distinct intermediate-object, determine the next-state lines at which such distinct intermediate-object is found and set bits of the fault-pattern that correspond to those next-state lines.

5.4 Use a next-state function to map *S/I* into a good next-state, $NS_G$, to obtain mapped-object:
   <label, S/I, $NS_G$, fault-pattern>.
508

5.5 Gather together all mapped-objects having common fault-name, good next-state and fault-pattern. Each such collection will continue as a single new fault-object. Assign a new fault-name to each new fault-object, and concatenate $NS_G$ with a "don't-care" input-vector, $I_x$, such that $NS_G.I_x$ becomes the new fault-propagation function, to create new fault-object:
   <new-label, $NS_G.I_x$> having a fault-pattern.
510

5.6 Place the new fault-objects onto the present-state lines for a next time-frame according to each new fault-object's fault-pattern.

5.6.1 Store a copy of each new fault object for use as a local-fault mask having format: <new-label, $NS_G.I_x$>.
512

5.7 Create/extend a History file to make a record of the new fault-objects and how these relate to the fault-objects from which they were derived.

FIG. - 5

(Prior Art) '571-Rule: $RLF = NS_G \cdot TF[1]I\text{-part}$ ← 700

(Prior Art) '683-Rule: $RLF = NS_G \cdot I_x$ ← 702

(Present Invention)  $RLF = (LF) \cap (NS_G \cdot I_x)$ ← 704

Where RLF means "Replacement Local Fault," $NS_G$ means "Good Next-State," $I_x$ means "Don't-Care Input Vector," LF means "Local Fault," and the "∩" symbol represents the intersection operation.

```
Primary input lines
IN1, IN2
Present-state lines
PS1, PS2
Primary output line
OUT = S1.I2
Next-state lines
NS1 = S1I3 + S2I1
NS2 = S0I1 + S1NI3 + S2I0
S0 = /PS1./PS2
S1 = /PS1.PS2
S2 = PS1./PS2
I0 = /IN1./IN2
I1 = /IN1.IN2
I2 = IN1./IN2
I3 = IN1.IN2
S0I1 = S0.I1
S1I2 = S1.I2
S1I3 = S1.I3
S1NI3 = S1./I3
S2I0 = S2.I0
S2I1 = S2.I1
Inverters
/IN1, /IN2, /PS1, /PS2, /I3
```
FIG. - 8
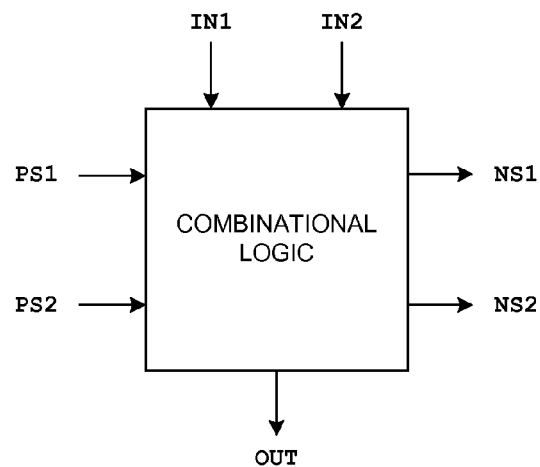
FIG. - 9
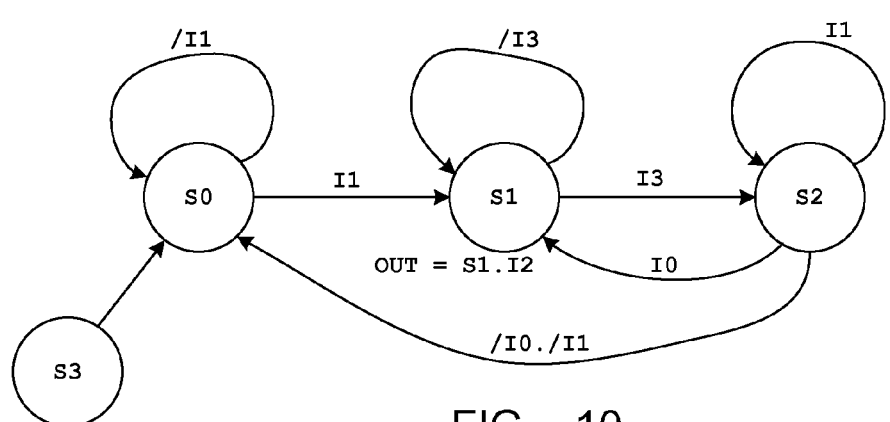
FIG. - 10

```
        CIRCUIT: SMALL    FAULT: NS1/0

GOOD 1-SETS
        S3      S2      S1      S0
NS1    0000    0010    1000    0000
NS2    0000    0001    0111    0010
OUT    0000    0000    0100    0000

TIME-FRAME[1]
At start of TF[1]
PS1    (), no imported fault-objects
PS2    ()

At end of TF[1]
NS1    <1 0000 0010 1000 0000>
NS2    ()
OUT    ()

INTER-TIME-FRAME PROCESS
FIG 5, STEP 5.1, DECOMPOSE INTO S/Is
NS1    <1 S2.I1>, <1 S1.I3>
NS2    ()

STEPS 5.2 - 5.3, ADD FAULT-PATTERN
<1-1 S2.I1,FP2>, <1-2 S1.I3,FP2>

STEP 5.4, MAP TO GOOD NEXT-STATE
<1-1 S2.I1->S2,FP2>, <1-2 S1.I3->S2,FP2>

STEP 5.5, GATHER INTO COMMON GROUPS
<1-1 S2.I1->S2,FP2> AND <1-2 S1.I3->S2,FP2>
      BECOME COMMON GROUP <2 S2.IX>,FP2

STEP 5.6, PLACE NEW FAULT-OBJECT ONTO PS LINES FOR NEXT
TIME-FRAME ACCORDING TO FAULT-PATTERN

STEP 5.6.1, CREATE REPLACEMENT LOCAL FAULT FOR NEXT TIME-
FRAME: RLF = (S2.I1, S1.I3) ∩ (S2.IX) = (S2.I1)

STEP 5.7, CREATE/EXTEND HISTORY FILE
HISTORY: <1-1 S2.I1->S2,FP2>
         <1-2 S1.I3->S2,FP2>
```

FIG. - 12(A)

```
TIME-FRAME[2]
At start of TF[2]
PS1    <2 0000 1111 0000 0000>
PS2    ()
RLF    <2 0000 0010 0000 0000>

At end of TF[2]
NS1    <2 0000 0010 0000 0000>
NS2    <2 0000 0011 0000 0000>
OUT    ()
```

```
INTER-TIME-FRAME PROCESS
STEP 5.1, DECOMPOSE INTO S/Is
NS1    <2 S2.I1>
NS2    <2 S2.I1>, <2 S2.I0>

STEPS 5.2 - 5.3, DETERMINE FAULT-PATTERN
<2-1 S2.I1,FP3>, <2-2 S2.I0,FP1>

STEP 5.4, MAP TO GOOD NEXT-STATE
<2-1 S2.I1->S2,FP3>, <2-2 S2.I0->S1,FP1>

STEP 5.5, GATHER INTO COMMON GROUPS
<2-1 S2.I1->S2,FP3> BECOMES <3 S2.IX>,FP3
<2-2 S2.I0->S1,FP1> BECOMES <4 S1.IX>,FP1

STEP 5.6, PLACE NEW FAULT-OBJECT ONTO PS LINES FOR NEXT
TIME-FRAME ACCORDING TO FAULT-PATTERN

STEP 5.6.1, CREATE REPLACEMENT LOCAL FAULT FOR NEXT TIME-FRAME
RLF = LF ∩ (S2.IX, S1.IX) = (S2.I1), (S1.I3)

STEP 5.7, EXTEND HISTORY FILE
HISTORY:  <1-1   S2.I1->S2,FP2>
          <1-2   S1.I3->S2,FP2>
              <2-1   S2.I1->S2,FP3>
              <2-2   S2.I0->S1,FP1>
```

FIG. - 12(B)

```
TIME-FRAME[3]
At start of TF[3]
PS1                                 <3 0000 1111 0000 0000>
PS2  <4 0000 0000 1111 0000>, <3 0000 1111 0000 0000>
RLF  <4 0000 0000 1000 0000>, <3 0000 0010 0000 0000>

At end of TF[3]
OUT  <4 0000 0000 0100 0000>, <3 0000 0100 0000 0000>
              * * * TESTS DETECTED * * *
```

```
POST-TEST-DETECTION PROCESS
STEP 12.1, DECOMPOSE OUTPUT FAULTS INTO S/Is
OUT  <4 S1.I2>, <3 S2.I2>

STEP 12.2, EXTEND HISTORY FILE
     <1-1 S2.I1->S2,FP2>
     <1-2 S1.I3->S2,FP2>
          <2-1 S2.I1->S2,FP3>
               <3 S2.I2->S0,OUT=0>
          <2-2 S2.I0->S1,FP1>
               <4 S1.I2->S1,OUT=1>

STEP 12.3, EXTRACT TEST PATTERN SEQUENCES
```

METHODS FOR GENERATING TEST PATTERNS FOR SEQUENTIAL CIRCUITS

CROSS-REFERENCE TO RELATED APPLICATIONS AND CLAIM OF PRIORITY

The present Patent Application is related to, and incorporates by reference, the full disclosures of each of the following: U.S. patent application Ser. No. 09/754,936, filed Jan. 5, 2001, now U.S. Pat. No. 6,789,222, titled "Single-Pass Methods for Generating Test Patterns for Combinational Circuits;" U.S. patent application Ser. No. 10/711,723, filed Sep. 30, 2004, now abandoned, titled "Single-Pass Methods for Generating Test Patterns for Sequential Circuits;" U.S. patent application Ser. No. 10/908,146, filed Apr. 28, 2005, now U.S. Pat. No. 7,231,571, titled "Single-Pass Methods for Generating Test Patterns for Sequential Circuits;" U.S. patent application Ser. No. 11/893,683, filed Aug. 16, 2007, now Published U.S. Patent Application No. 2009/0049354, titled "Single-Pass, Concurrent-Validation Methods for Generating Test Patterns for Sequential Circuits," and U.S. Provisional Patent Application, Ser. No. 61/084,231, filed Jul. 28, 2008, titled "Single-Pass Method for Generating Test Patterns for Sequential Circuits." Parts of the present Patent Application claim priority from U.S. Provisional Patent Application, Ser. No. 61/084,231, and the remainder claims priority from U.S. patent application Ser. No. 11/893,683.

FIELD OF THE INVENTION

The invention relates generally to the field of electrical computers and digital processing systems, and more particularly to test pattern generators (class 714, subclass 738).

BACKGROUND ART

U.S. Pat. No. 6,789,222 (the '222 patent) teaches complete test pattern generation methods for combinational circuits, and describes a robust set of fault-propagation rules appropriate for use in sequential test pattern generation. The methods of the '222 patent find all test patterns for all detectable faults during a single pass through a circuit-level sorted description of a combinational circuit.

A sequential circuit can be represented as a combinational part and a separate feedback storage part (prior art FIG. 1). The sequential circuit can be analyzed as an iterative array of the combinational parts, each part containing a copy of the fault (prior art FIG. 2; see for example, K-T Cheng, "Tutorial and Survey Paper: Gate-Level Test Generation for Sequential Circuits," ACM Trans. Design Automation of Electronic Sys. Vol. 1, No. 4, October 1996, Pages 405-442).

The teachings of the '222 patent can be applied to such an iterative array for generating test pattern sequences for sequentially detectable faults. This approach is taken in U.S. Pat. No. 7,231,571 (the '571 patent), and in co-pending U.S. patent application Ser. No. 11/893,683 (the '683 patent application). Both teach single-pass methods for sequential test pattern generation. However, in each, the appearance of a fault at a circuit primary output line is not a reliable indication of the existence of a valid test sequence. As a result, potential test sequences must be independently validated.

What is needed is a deterministic test pattern generator for sequential circuits that finds test pattern sequences for sequentially detectable faults during a single pass through an iterative array representation of a sequential circuit, without a need for independent validation.

The test pattern generator should use data structures having size bounded by the number of state and input variables required during an initial time-frame.

It should be unnecessary to predict a maximum number of time-frames that may be required, instead simply proceeding from time-frame to time-frame until a test is found or until the process is otherwise terminated.

Finally, for all faults during all subsequent time-frames, the test pattern generator should permit reuse of path-enabling functions created and used during an initial time-frame.

SUMMARY OF THE INVENTION

These goals and others that will become apparent are met by the present invention, which implements single-pass methods for generating test patterns for sequential circuits.

By using a local-fault at each time-frame, fault-objects arriving at one or more circuit primary output lines reliably and unambiguously signal the existence of a valid test pattern sequence. The valid sequence is reconstructed from a history file and is applied to test a sequential circuit.

In another specific embodiment of the invention, in all time-frames following an initial time-frame, the local-fault is replaced by a logical intersection of the local-fault with a fault-mask.

BRIEF DESCRIPTION OF THE DRAWING

FIG. 5 is a table describing the steps of an inter-time-frame process.

FIG. 8 is a block diagram of a combinational part of a simple sequential circuit used in an example.

FIG. 9 is a list of logic equations defining the combinational part of the simple sequential circuit.

FIG. 10 is a state transition graph for the simple sequential circuit.

FIGS. 12(A), 12(B), and 12(C) are a table illustrating an example of a single-pass method for generating test patterns applied to the simple circuit of FIGS. 8-11.

DEFINITIONS

Figure 1:
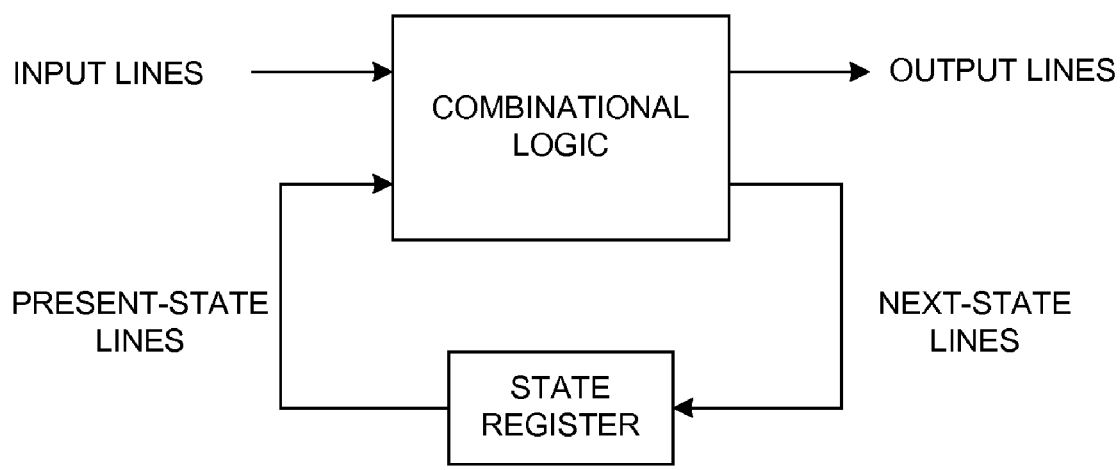
FIG. 1 is a prior art block diagram illustrating a sequential circuit partitioned into a combinational part and a separate state register feedback part.
Figure 2:
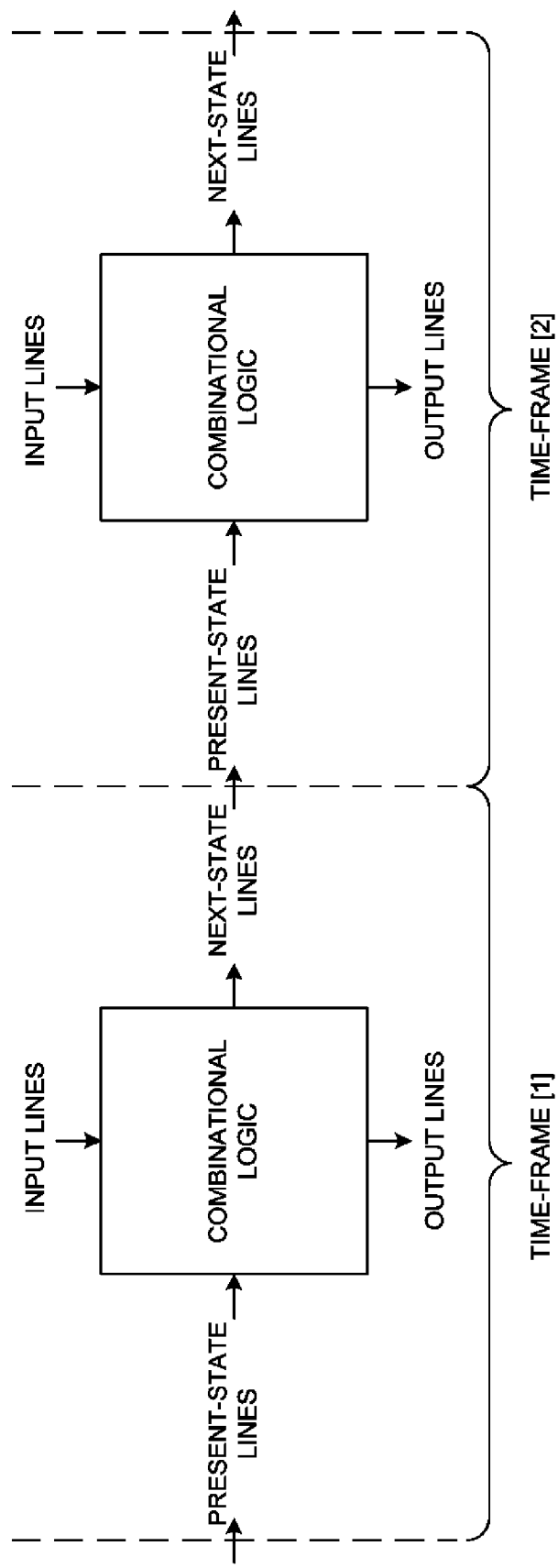
FIG. 2 is a prior art block diagram illustrating a sequential circuit represented as an iterative array of the combinational parts.

Single-pass method: a method for generating test patterns for multiple faults during a single pass through a circuit description of a combinational or a sequential circuit.

Time-frame: a single pass through a copy of the combinational part of a sequential circuit using combinational test pattern generation as defined in the '222 patent.

Path-enabling function: a Boolean function of present-state and primary input variables. A 1-set defines all state/ input vectors that cause a specific net of a circuit to be at logic level ONE. A 0-set defines all state/input vectors which cause the net to be at logic level ZERO.

Fault-propagation function: a Boolean function of present-state and primary input variables that cause a stuck-at fault to be present at a specific net of a circuit. The existence of the fault at the net is represented by a fault-object having a non-zero fault-propagation function.

Fault-object: a two-part object including a label and a fault-propagation function of present-state and primary input variables. A fault-object is informally referred to as a "fault."

Good next-state: a state that a good copy of a sequential circuit will advance to in response to a given present-state and primary input-vector. A good next-state is designated by the symbols $NS_G$.

Don't-care input vector: the don't-care configuration of the primary input variables, designated by the symbols $I_X$.

New fault-object: a fault-object for which the value of the fault-propagation function is equal to a good next-state and a don't-care input vector, designated by the symbols $NS_G.I_X$. Also referred to as "search objects."

Local-fault: a fault-object having a fault-propagation function equal to the value of the 1-set for a faulty net, representing a stuck-at-0 fault, and equal to the value of the 0-set for a stuck-at-1 fault. A local-fault is designated by the symbols LF.

Replacement-local-fault: is a fault-object created and saved during an inter-time-frame process and replaces the local-fault during a next time-frame. The replacement-local-fault is designated by the symbols RLF, and has a fault-propagation function whose value is the logical intersection of a local-fault and the fault-mask, $NS_G.I_X$. Thus RLF=LF ∩ $NS_G.I_X$.

Present-state/input-vector: a Boolean function of the present-state and primary-input variables designated generally by the symbols S/I.

Fault-pattern: a binary number whose value is determined by the next-state lines at which the decomposed components of a fault appear at the conclusion of a time-frame. The individual bits of the binary number correspond to the individual next-state lines. A specific bit will be a "1" when a given component is present at the corresponding next-state line, and will be "0" otherwise. A fault-pattern is designated by the symbols FP.

Test pattern sequence: begins with a fault-activating S/I and continues with a sequence of zero or more input vectors, Is, that advance an activated fault to a primary output; includes a good next-state, $NS_G$, and the good output level of the one or more primary outputs at which the fault makes itself known, i.e., is detectable. The format of a test is <fault-name, fault-activating S/I, I, I, . . . , $NS_G$, $OUT_G$>. Informally referred to as "test patterns" or simply "tests."

DESCRIPTION OF THE PREFERRED EMBODIMENT

Figure 3:
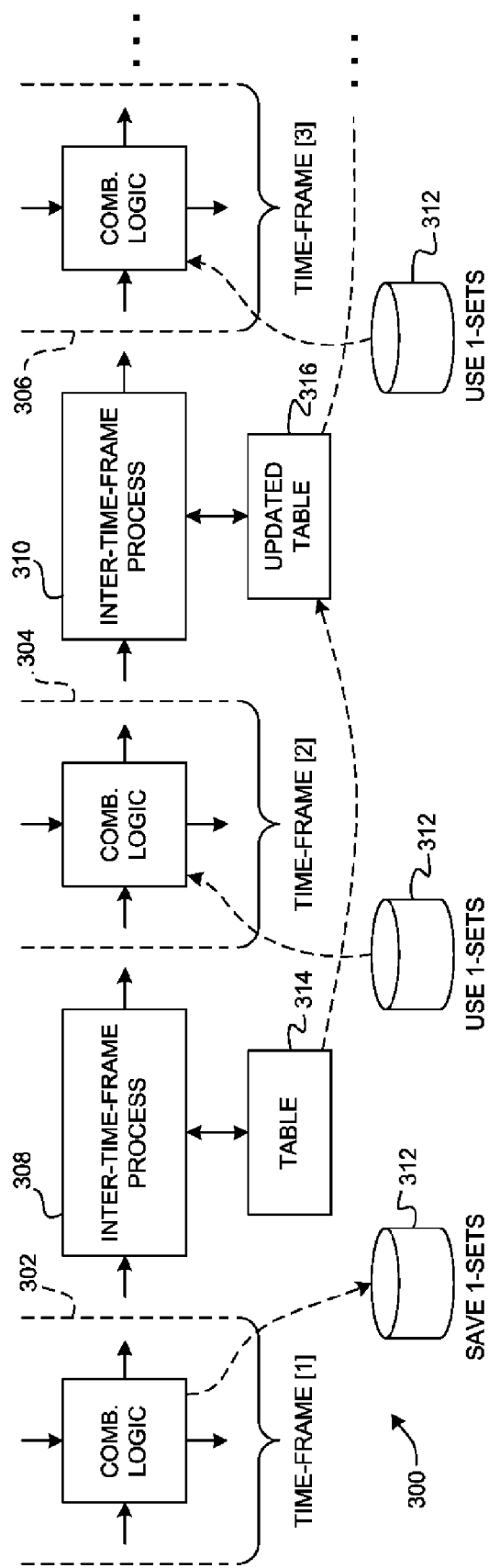
FIG. 3 is a block diagram illustrating an iterative array representation including an inter-time-frame process between each time-frame.

With reference to FIG. 3, there is shown a block diagram illustrating an iterative array representation of a sequential circuit, including an inter-time-frame process between each time-frame of the array according to one aspect of the present invention, forming a composite array, and designated generally by the reference numeral 300.

The composite array 300 includes a first time-frame 302, a second time-frame 304, a third time-frame 306, an inter-time-frame process block 308, a second inter-time-frame process block 310, storage 312 for saving path-enabling 1-sets, and for providing the saved 1-sets at subsequent time-frames, a table 314 for storing path history, and an updated table 316. FIG. 3 is exemplary only; a specific composite array may include, for example, a different number of time-frames and inter-time-frame processes.

During the first time-frame 302, the methods taught in the '222 patent find test patterns for all combinationally detectable faults. Faults that are potentially sequentially detectable appear at the next-state lines as fault-objects, each including a fault-propagation function.

In a specific embodiment, all 1-sets created during the first time-frame are stored 312 for reuse during subsequent time-frames. 0-sets are also required for path-enabling, and are derived by complementing the saved 1-sets. In another specific embodiment, as taught in the '222 patent, no longer needed Boolean function storage is released for reuse.

As defined above, a fault-propagation function is a Boolean function of present-state and primary input variables. During a first time-frame a fault-propagation function represents every present-state/primary input vector combination that activates and propagates a fault to a specific net within the circuit. Fault propagation functions that have arrived at next-state lines at the end of the first time-frame represent present-state/primary input vector combinations that can activate and propagate a fault to one or more of the next-state lines.

A specific embodiment of the method for generating test patterns for sequential circuits begins with a purely combinational time-frame (Time-Frame[1], 302), followed by an inter-time-frame process 308 that creates new search objects for a next time-frame (Time-Frame[2], 304). Thereafter, each time-frame is followed by the creation of new search objects, and so on until no faults remain to be detected, no tests exist for remaining faults, or the process is otherwise terminated. A table 314 is used for keeping track of the new search objects, as search history, and how the new search objects relate to one another. The search history is created 314 during an initial inter-time-frame process 308, and is thereafter updated 316 during each subsequent inter-time-frame process 310.

As the single-pass method works its way through the composite iterative array, faults will appear at the primary output lines, indicating that a test pattern sequence for a fault has been identified. Faults that continue to be potentially, but are not yet detectable, appear at one or more next-state lines.

The generation of tests for faults that (1) reappear at the next-state lines of subsequent time-frames, (2) repeating an earlier configuration, and (3) without an intervening appearance at a primary output line, are purged. No test sequence for these faults exists. Such faults are sequentially undetectable in that, though they can be activated and propagated through a number of successive time-frames, they cannot be successfully propagated to a primary output line during any time-frame.

Upon completion of a final time-frame, the successful test pattern sequences are reconstructed using the updated table entries (316 of FIG. 3).

Figure 4:
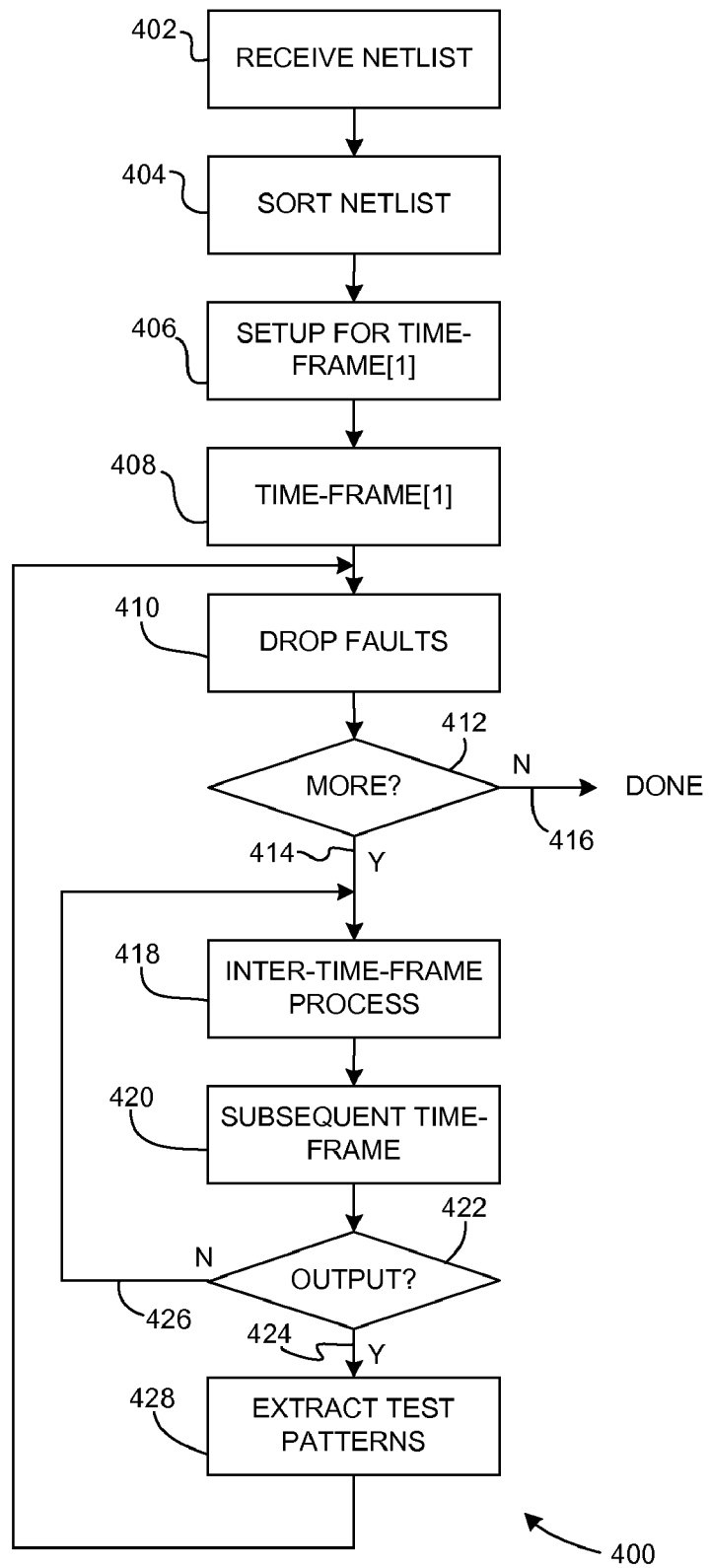
FIG. 4 is a flow chart illustrating a process for generating test patterns for sequential circuits.

FIG. 4 is a flow chart illustrating a process for generating test patterns for sequential circuits according to another aspect of the present invention. The process is designated generally by the reference numeral 400 and includes a step 402 for receiving a netlist description of a sequential circuit, a step 404 for sorting the netlist into an ascending circuit-level order, a step 406 for initializing storage locations corresponding to the nets for the primary input lines and the present-state lines, a step 408 representing combinational test pattern generation for a first time-frame of an iterative array representation of the sequential circuit, a step 410 for removing faults from a list of faults for which tests are sought when a test has been found following a first time-frame (referred to as "dropping faults"), a step 412 for determining whether faults are present at one or more next-state lines, a step 418 for initializing storage locations corresponding to the nets for the primary input lines and the present-state lines for each subsequent time-frame of the iterative array (referred to as an "inter-time-frame process"), a step 420 for performing a combinational test pattern generation for subsequent time-frames of the array, a step 422 for determining whether any fault has arrived at a primary output line, and a step 428 for extracting test patterns from a history file when a fault has arrived at a primary output line following a subsequent time-frame.

At step 404, a received netlist is sorted into an ascending circuit level order commencing at the level of the primary inputs and the present-state lines. In a specific embodiment, the received netlist has been ordered so that net definitions may be located rapidly, while a separate list of all net names is created and is sorted, at step 404, into an ascending circuit level order.

At step 406, the setup for the first time-frame creates and stores 1-sets and empty fault-objects for each primary input line and for each present-state line. The empty fault-objects include an all-zero fault-propagation function to indicate that no faults are being imported to the first time-frame. The search conducted during a time-frame is an inductive process, and before it begins present-state and primary input values are initialized.

At the completion of the first time-frame (step 408), combinationally detectable faults are present at one or more primary outputs. In a specific embodiment, these faults are removed from the list of faults yet to be detected ("drop faults", step 410), and are added to a list of detected faults. Undetected faults, if they have been successfully activated and propagated, appear at one or more of the next-state lines in the form of fault-objects having non-zero fault-propagation functions. A test is made at step 412 to determine whether any fault has reached a next-state line. If so ("Y", 414), the process continues at step 41 8. If not ("N", 416), the process is complete ("DONE").

The setup for all subsequent time-frames (step 418, referred to herein as the "inter-time-frame process") relies on 1-sets created and saved to storage before and during the first time-frame. The specific details of the inter-time-frame process are described with respect to FIG. 5, but include the creation of new search objects at the present-state lines, the creation of replacement local-faults for use during a next time-frame, and the creation and extension of history table entries permitting the reconstruction of valid test pattern sequences at the end of a time-frame.

The subsequent time-frame step 420 differs from the first time-frame step 408 in at least two important respects: (1) in a specific embodiment, 1-sets stored before and during the first time-frame are reused during all subsequent time-frames so that computational efficiency is enhanced; and (2) the local-fault generation process used during the first time-frame (fault activation) is replaced during the subsequent time-frames by use of modified local-faults created and saved during a preceding inter-time-frame process (step 418). These modified local-faults are referred to as replacement local-faults.

In another specific embodiment, the 1-sets are not saved during the first time-frame, and no-longer-needed storage is released so that larger circuits and circuit partitions can be handled (see the '222 patent). Instead, the 1-sets are recreated during each subsequent time-frame. Though able to handle larger circuits/partitions, a person having an ordinary level of skill will appreciate that operating in this manner is often less efficient because of the need to recreate the path-enabling 1-sets during each time-frame.

At step 422 a test is performed to determine whether any fault has reached a primary output line following a subsequent time-frame. If so ("Y" 424), the process continues at step 428. If not ("N" 426), the process continues from step 412.

When a fault has reached a primary output line following a subsequent time-frame, the existence of a valid test pattern sequence for a fault has been detected. At step 428 the fault propagation function at a primary output line is combined with selected entries in the history table to extract a test pattern sequence.

FIG. 5 is a table describing the steps of an inter-time-frame process according to another aspect of the present invention. The inter-time-frame process is designated generally by reference numeral 500 and corresponds to elements 308, and 310 of FIG. 3, and to step 418 of FIG. 4.

The inter-time-frame process 500 includes a definition of a fault-object 502, an intermediate-object 504, a pattern-object 506, a mapped-object 508, a new fault-object 510, and a local-fault mask 512. The inter-time-frame process 500 is presented as a numbered series of steps, 5.0 through 5.7.

At step 5.0 a fault-object 502 is defined and has two parts: a label, and a fault-propagation-function of present-state and primary input variables.

Step 5.1 begins immediately following the end of a time-frame preceding the inter-time-frame process 500. One or more fault-objects 502 can have arrived at one or more circuit next-state lines. For each such fault-object 502, the fault-propagation function part is decomposed into its component state/input vectors S/I using Shannon decomposition. The component S/Is are used to form intermediate-objects 504 having two parts: a label and a fault-propagation function having value S/I. It will be apparent to a person having an ordinary level of skill that multiple such intermediate-objects 504 can result from a typical fault-object 502. This process is carried out next-state line by next-state line until complete.

The result of step 5.1 is that each fault-object 502 arriving at a circuit next-state line will have been decomposed into one or more intermediate-objects 504.

At step 5.2 all intermediate-objects 504 are examined and a representative pattern-object 506 having format <label, S/I, empty-fault-pattern> is created for each distinct intermediate-object <label, S/I>. The initial fault-pattern is set to an all-zeros value. In a specific embodiment, a fault-pattern is a binary number in which each bit corresponds one-to-one with a specific different next-state line. A pattern-object 506 is a template for the class of intermediate-objects 504 sharing a common <label, S/I> across all the next-state lines.

At step 5.3, as each intermediate-object 504 is examined, the specific next-state line at which it is found is noted, and the fault-pattern bit corresponding with the specific next-state line of the representative pattern-object 506 is set to "1".

At the completion of step 5.3, the fault-pattern of each representative pattern-object 506 will indicate at which next-state lines the specific intermediate-objects, <label, S/I>, appeared. The single-pass methods of the present invention process multiple faults during a single-pass through the composite array 300 of FIG. 3 (see, for example, the '222 and '571 patents and the '683 patent application). Thus at the completion of step 5.3, there will be multiple pattern-objects 506 having different fault-names, and multiple pattern-objects 506 having the same fault-name but different S/Is.

During step 5.4, the S/I part of each pattern-object 506 is mapped into a good next-state, $NS_G$. The contents of the pattern-object 506 and the good next-state $NS_G$ are used to form a mapped-object 508 having format: <label, S/I, $NS_G$, fault-pattern>.

At step 5.5, the mapped-objects 508 are gathered into groups having common label, $NS_G$, and fault-pattern. It is very likely that two or more groups will share a common label and $NS_G$, differing only in the fault-pattern. Such groups will have arisen from different S/Is, but will have been mapped to a common $NS_G$.

Some method must be used to distinguish such groups. One such method is to give each group a new-label. Another is to form a sub-label, for example, using the fault-name as the label and using an integer, such as the fault-pattern, as an index or sub-label. Fault-objects from the same group are able to interact with each other during a time-frame according to the circuit structure and the Boolean-function-combining-rules used. Fault-objects from different groups are not allowed to interact. These are the reasons that a different replacement local-fault is created and used for each new fault-object that is created. This feature of the single-pass method permits multiple faults to be processed during the single-pass.

Each group created at step 5.5 is used to create a new fault-object 510 having a new-label and a fault-pattern.

At step 5.6 the new fault-objects are placed upon the present-state lines for a next time-frame according to their fault-patterns. In other words, a new fault-object 510 is placed upon present-state lines that correspond to the next-state lines at which were found the S/I, from which the new fault-object's $NS_G$ was mapped.

In one embodiment of the single-pass method 400 (FIG. 4), a local-fault LF is inserted at a faulty net for each time-frame. This local fault represents the copy of a fault that must be present at each time-frame.

In another specific embodiment of the single-pass method 400, a fault-mask 512 is created and saved (step 5.6.1). The fault-mask 512 is a copy of the new fault-object 510 to which it corresponds. When a fault-mask is being used, rather than inserting a local-fault at a faulty net in each time-frame, the fault-propagation function portion $NS_G.I_X$ of the fault-mask is logically intersected with the fault-propagation function portion of the local-fault LF to form the fault-propagation function for a replacement local-fault RLF=LF $\cap$ $NS_G.I_X$. The replacement local-fault is inserted at the faulty net.

The purpose of a replacement local-fault is to reduce unnecessary work during a next inter-time-frame process 500. During all time-frames subsequent to an initial time-frame, results relating to the $NS_G$ are the only results of interest. A subsequent time-frame and the inter-time-frame process immediately following are solving a specific problem: given objects <label, $NS_G.I_X$> placed onto present-state lines according to a fault-pattern, what values of $I_X$, if any, propagate the fault to one or more next-state lines? In this context, only results for $NS_G$ are of interest. The local-fault LF often includes S/Is for states other then $NS_G$. These irrelevant states may appear at the next-state lines and must be ignored as they add no new information during this subsequent time-frame and consume computational effort during the time-frame and during the inter-time-frame process that follows. Using a replacement local-fault such as created during step 5.6.1 is one way to filter out unwanted S/Is.

Finally, at step 5.7 the history file is updated to reflect the results of the search during the immediately preceding time-frame. During an inter-time-frame process immediately following an initial time-frame, step 5.7 creates initial entries in the history file. During all subsequent inter-time-frame processes, step 5.7 extends the history file based upon results of the preceding steps of the process.

Figures 6, 7:
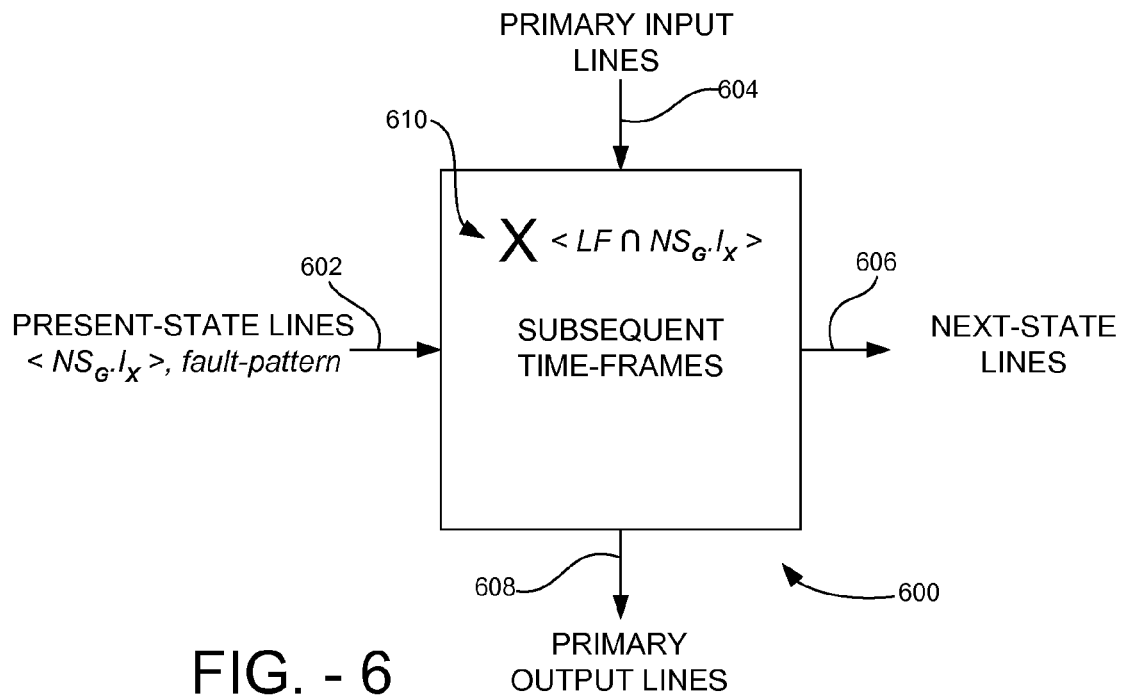
FIG. 6 is a block diagram illustrating a typical time-frame, its input and output lines and a local-fault.
FIG. 7 is a table illustrating prior art and present invention replacement local-fault formats.

FIG. 6 is a block diagram illustrating a subsequent time-frame, its input and output lines and a local-fault. The subsequent time-frame is designated generally by the reference numeral 600 and includes present-state lines 602, primary input lines 604, next-state lines 606, primary output lines 608 and a replacement local-fault 610.

As described above with respect to step 5.6.1 of FIG. 5, a subsequent time-frame 600 answers the question: given a particular circuit, fault-objects <label, $NS_G.I_X$> at the present-state lines 602 according to a fault-pattern, and replacement local-fault LF $\cap$ $NS_G.I_X$, what values of $I_X$, if any, bring the fault to one or more next-state lines 606, or alternatively, to at least one primary output line 608? Alternatively, a local-fault LF, rather than the replacement local-fault, can be used to answer the same question. The purpose of FIG. 6 is to highlight the importance of this central question to the single-pass method.

FIG. 7 is a table illustrating the applicant's own prior art and present invention replacement local-fault formats. The '571 patent employed a replacement local-fault in which the input-vector portion was equal to an I-part for an initial time-frame, TF[1]I-part, designated generally by the reference numeral 700. The '683 patent application uses an I-part equal to a don't-care input vector $I_X$.

When either $NS_G$.TF[1]I-part or $NS_G.I_X$ are proper subsets of the local-fault LF, the appearance of fault at a primary output line 608 signals the discovery of a valid test pattern sequence for the fault. On the other hand, when $NS_G$.TF[1]I-part or $NS_G.I_X$ are not proper subsets of the local-fault LF, the appearance of fault at a primary output line cannot guarantee the existence of a valid test. When either of these alternative forms is not a proper subset, the form represents a mixing of portions of the 1-set with portions of the 0-set and does not represent a proper subset of the local-fault, producing erroneous results.

The use of the local-fault, or alternatively the replacement local-fault RLF=LF $\cap$ $NS_G.I_X$ do not mix portions of the 1-set and 0-set and therefore provide correct results.

A SIMPLE EXAMPLE

FIGS. 8-11, and 12(A)-12(C) relate to the following simple example that demonstrates the single-pass method for generating test patterns for sequential circuits.

The simple sequential circuit used in the example has been previously used in the '571 patent and in the '683 patent application. A block diagram for a combinational part of the simple circuit is shown in FIG. 8. The circuit has two primary input lines (IN1,IN2), two present-state lines (PS1,PS2), one primary output line (OUT), and two next-state lines (NS1, NS2). The combinational part of the circuit is defined by logic equations shown in FIG. 9.

It will be appreciated that in the complete simple sequential circuit, line NS1 is connected back to the line PS1 through a storage element, for example a delay flip-flop (not illustrated), and that the line NS2 is connected back to the line PS2 through a second delay flip-flop (also not illustrated).

Figure 11:
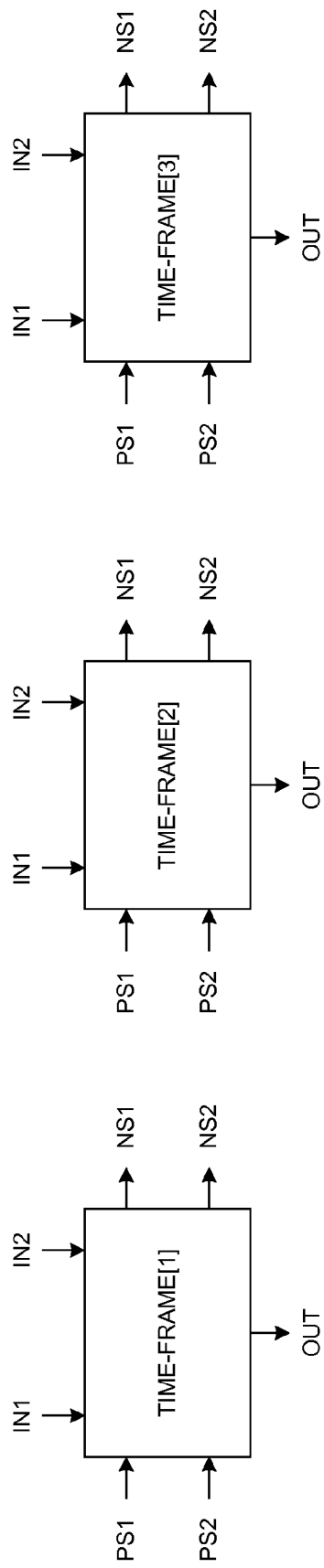
FIG. 11 is an iterative array of three time-frames for the simple sequential circuit.
Figure 12C:
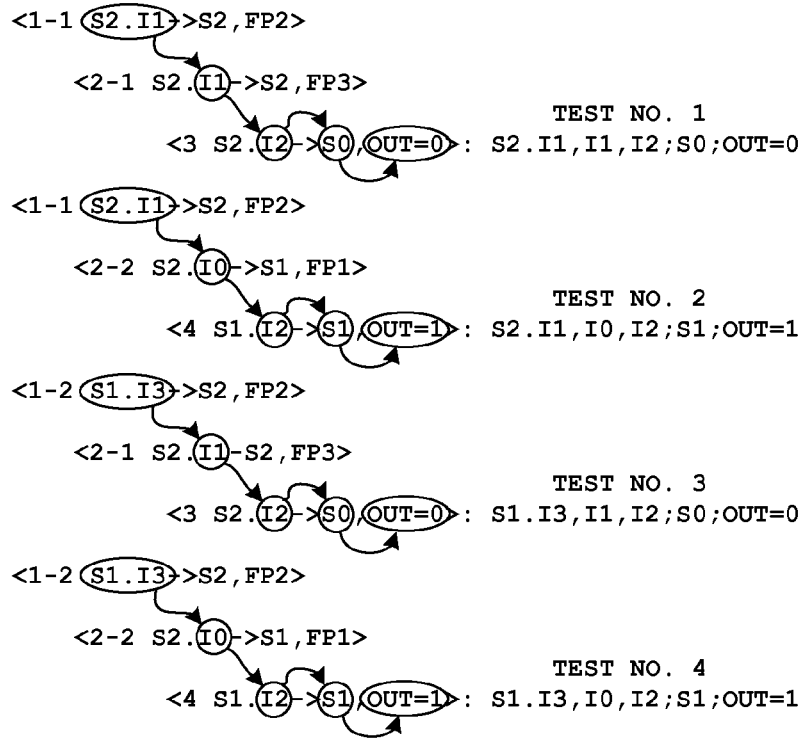

The circuit defines a finite state machine, a state transition graph for which is illustrated in FIG. 10. An iterative array of the combinational part of the circuit showing three time-frames is illustrated in FIG. 11. FIGS. 12(A)-(C) illustrate inputs, intermediate results, and outputs at successive stages of the single-pass test pattern generation process.

With respect to the logic equations of FIG. 9, a logical AND is indicated by a decimal point placed between adjacent signal names. A logical inclusive-OR is indicated by a plus sign placed between two signal names. Placing a forward slash immediately preceding a signal name indicates a logical NOT. Consider the equation defining signal NS2: NS2=S0I1+S1NI3+S2I0. The signal line (net) named NS2 is driven by the output of a 3-input OR gate whose inputs are connected to the signal lines named S0I1, S1NI3, and S2I0, respectively. In like manner, the signal line named S1 is driven by the output of a 2-input AND gate whose inputs are connected to the signal lines named /PS1 and PS2, respectively.

As shown in FIG. 10, state S3 is not reachable in a fault-free copy of the circuit, except possibly during a power-ON sequence, in which case state S3 will advance to state S0.

Primary input signal IN1 is the most significant bit of the (IN1, IN2) pair. Present-state signal PS1 is the most significant bit of the (PS1, PS2) pair. Next-state signal NS1 is the most significant bit of the (NS1, NS2) pair. Thus state S2, for example, is defined by the combination PS1=1 and PS2=0, while input vector I1 is defined by the combination IN1=0 and IN2=1.

A circuit name and a fault-name for this simple example are shown at the top of FIG. 12(A). The circuit name is SMALL and the fault-name is NS1/0, i.e., the signal NS1 stuck-at-0. Four test pattern sequences will be found for this fault following the end of TIME-FRAME[3].

FIG. 12(A) next lists the good path-enabling functions, 1-sets, for the next-state lines NS1, NS2, and for the single primary output signal, OUT. Each of these 16-bit functions has been partitioned, for ease of reading, into four 4-bit groups corresponding to the states S3-S0, left-to-right, respectively. Also reading left-to-right across the path-enabling function for signal NS1, there is a ONE within the group for state S2 and another within the group for state S1. The four bits of each group, reading left-to-right, correspond to primary input vectors I3, I2, I1, and I0, respectively. Thus, the two isolated ONEs correspond to S/Is S2.I1 and S1.I3. This function of input and state variables means that the signal NS1 will be at logic level ONE during state S2 when an input vector I1 is applied, and also during state S1 when input vector I3 is applied. Signal NS1 will have a ZERO value for all other combinations of state and input vector.

FIG. 12(A) shows the activities of an initial time-frame, TIME-FRAME[1], immediately following the good 1-sets. During an initial time-frame no faults are imported from a previous inter-time-frame process. Thus the present-state lines PS1, PS2 both are followed by the symbols ( ), representing the presence of no imported faults.

Though not illustrated in FIG. 12(A), path-enabling functions are initialized for the present-state lines PS1, PS2 and for the primary input lines IN1, IN2 before the start of TIME-FRAME[1]. As TIME-FRAME[1] proceeds to its end the initialized 1-sets are used inductively, gate-by-gate, circuit level-by-circuit level to create all remaining 1-sets, to activate a local-fault for the net NS1 to represent the fault NS1/0, and for resulting propagated fault-objects that will eventually appear at one or more of the next-state lines, NS1 and NS2.

At the end of TIME-FRAME[1] the fault NS1/0 has been activated and has been propagated to the NS1 next-state line. The fault does not appear at the NS2 line, nor at the primary output line OUT, each represented by the symbols ( ). The fault is represented at the NS1 line as a fault-object having a label and a fault-propagation function. This simple example uses positive integers as labels, and the fault-object at the NS1 line has the label "1". The fault-propagation function has not yet been decomposed into its component S/Is. Thus, the fault at the NS1 line at the end of TIME-FRAME[1] is represented by the symbols <1 0000 0010 1000 0000>, where the leftmost "1" is the label and the four 4-bit groups are the fault-propagation function. The fault-propagation function for the fault at line NS1 reveals that the fault NS1/0 has been activated and propagated to line NS1 for present-state/input vector combinations S2.I1 and S1.I3.

The local-fault for the circuit SMALL and for the fault NS1/0 is represented by the same symbols, LF=<1 0000 0010 1000 0000> because, as can be seen by the good 1-set for NS1 at the top of FIG. 12(A), those are the S/Is that force the signal NS1 to be at logic level ONE, as required for a stuck-at-0 fault.

As noted above, the fault is not present at the NS2 line and that fact is represented by the symbols ( ). This representation is equivalent to a fault having an all-zeros fault-propagation function, i.e., there is no state/input combination that will activate and propagate the fault NS1/0 to the NS2 line for TIME-FRAME[1] of the circuit SMALL. This statement is true also for the primary output line OUT.

A first inter-time-frame process is illustrated at the lower half of FIG. 12(A) and refers to the numbered steps shown in FIG. 5.

At step 5.1 the fault-propagation functions of fault-objects appearing at next-state lines at the end of TIME-FRAME[1] are decomposed into component S/Is. The individual S/Is are used to form the intermediate-objects <1 S2.I1> and <1 S1.I3>.

At steps 5.2-5.3 fault-patterns are determined and are used to convert intermediate-objects to their representative pattern-objects. Each fault-pattern will be one of FP1, FP2, and FP3. FP1 is used when the intermediate-object is found only at next-state line NS2. FP2 when found only at NS1, and FP3 when found at both NS1 and NS2. The resulting pattern-objects are <1-1 S2.I1 ,FP2> and <1-2 S1.I3,FP2>, the labels of the intermediate-objects are differentiated in the pattern-objects.

At step 5.4 the S/I of each pattern-object is mapped to a good next-state, $NS_G$, and used to form the mapped-objects <1-1 S2.I1→S2,FP2> and <1-2 S1.I3→S2,FP2>. Reference to the state transition diagram, FIG. 10, shows that S2.I1 remains at S2, while S1.I3 advances to S2.

At step 5.5 the resulting mapped-objects are gathered into groups sharing common fault-name, good next-state, and fault-pattern. Mapped-objects <1-1> and <1-2> share fault-name NS1/0, good next-state S2, and fault-pattern FP2, and are therefore gathered into one common group to form new fault-object <2 S2.$I_X$> having fault-pattern FP2. The symbols <1-1> and <1-2> are used as a shorthand here for <1-1 S2.I1→S2,FP2> and <1-2 S1.I3→S2,FP2>, respectively.

At step 5.6 the new fault-object is placed onto present-state line PS1 for a next time-frame, according to the fault-pattern FP2. It will be appreciated that the symbols <2 S2.$I_X$> are merely a convenient representation for the symbols <2 0000 1111 0000 0000>, which expression is the new fault-object placed onto line PS1 for use during the next time-frame. No fault-object is placed onto the present-state line PS2.

At step 5.6.1 a replacement local-fault is created for use during the next time-frame. RLF=LF ∩ $NS_G.I_X$=(S2.I1, S1.I3) ∩ (S2.$I_X$)=(S2.I1).

Finally, at step 5.7 a history file is created having the two members:

<1-1 S2.I1→S2,FP2> and <1-2 S1.I3→S2,FP2>.

A next time-frame, TIME-FRAME[2], begins at the top of FIG. 12(B). Present-state line PS1 has imported new fault-object <2 0000 1111 0000 0000>, while line PS2 has no imported fault-object, indicated by the symbols ( ). A replacement local-fault <2 0000 0010 0000 0000> will be used during this time-frame to represent the copy of fault which must be present in each time-frame at the net NS1.

At the end of TIME-FRAME[2] fault-objects appear at both next-state lines NS1 and NS2. No fault-object appears at the primary output line OUT.

A word about the data structure illustrated with respect to the time-frame versus the human-readable form used with respect to the inter-time-frame process: why the difference in form?

The specific data structure used to represent path-enabling and fault-propagation functions depends on several factors, one of which in this example is ease of representation. In a realistic test pattern generation system it is more likely that some form of binary decision diagram representation will be used. In this simple example, however, the data structure being used has the advantage of simplicity. It will be appreciated by persons having an ordinary level of skill, that the single-pass method for generation of test pattern sequences is independent of the actual data structure employed.

In the time-frame descriptions, the data structures are shown in their long form to serve as a reminder that the process occurring during each time-frame is manipulating complex data structures—applying Boolean function combining rules to complex data structures. For a detailed explanation of what takes place during a time-frame, including the actual Boolean function combining rules, reference can be made to the '222 patent. On the other hand, during an explanation of what takes place during an inter-time-frame process, achieving a clear understanding of the process steps is essential, hence the human readable form using S/Is and FPs. In an actual inter-time-frame process complex data structures are employed.

A second inter-time-frame process is shown at FIG. 12(B) following the end of TIME-FRAME[2].

Decomposition of fault-propagation functions during step 5.1 results in an intermediate-object <2 S2.I1> at next-state lines NS1 and NS2, and a second intermediate-object <2 S2.I0> at next-state line NS2 only. Note that the intermediate-objects at lines NS1 and NS2 have the same label. That is because the Shannon decomposition occurring at step 5.1 is carried out separately for each next-state line, thus there is no likelihood of confusion, and also there is no communication of results between the next-state lines.

At step 5.2 the intermediate-object <2 S2.I1> at next-state line NS1 is used to form a pattern-object <2-1 S2.I1, fault-pattern> having fault-pattern equal to "00". When the intermediate-object <2 S2.I1> at next-state line NS2 is encountered during step 5.2, it is discovered that a pattern-object <2-1> has already been created based on the intermediate-object <2 S2.I1>. Also at step 5.2, the intermediate-object <2 S2.I0> at line NS2 is used to form a pattern-object <2-2 S2.I0, fault-pattern> also having fault-pattern equal to "00".

At step 5.3 the presence of the intermediate-object <2 S2.I1> at line NS1 results in the setting to ONE of the most-significant bit of the fault-pattern of the pattern-object <2-1 S2.I1, fault-pattern>, and the presence of <2 S2.I1> at line NS2 results in the setting to ONE of the least-significant bit of the fault-pattern: <2-1 S2.I1,FP3>. The presence of the intermediate-object <2 S2.I0> at line NS2 results in the setting to ONE of the least-significant bit of the fault-pattern of the pattern-object <2-2 S2.I0, fault-pattern>: <2-2 S2.I0,FP1>.

At step 5.4 the S/Is of the resulting pattern-objects are mapped to good next-states to obtain mapped-objects:
<2-1 S2.I1→S2,FP3>, and <2-2 S2.I0→S1,FP1>.

It is important to base fault-pattern determination upon the component S/Is rather than upon the mapped $NS_G$S. The reason is because the mapping conceals information about history: several S/Is having different fault-patterns can map to a common good next-state. Information about specific S/Is can be important during reconstruction of test pattern sequences from history. Also, the S/Is can be groups of S/Is, and in many cases can be incompletely specified S/Is.

At step 5.5 the mapped-objects are gathered into groups sharing common fault-name, good next-state, and fault-pattern. Mapped-objects <2-1> and <2-2> share the common fault-name NS1/0 but do not share common good next-state or fault-pattern. Therefore, mapped-object <2-1> is used to form the new fault-object <3 $S2.I_X$> having fault-pattern FP3, and mapped-object <2-2> is used to form the new fault-object <4 $S1.I_X$> having fault-pattern FP1.

At step 5.6 the new fault-objects <3> and <4> are placed upon the present-state lines for TIME-FRAME[3] according to their respective fault-patterns.

At step 5.6.1 replacement local-faults for use during TIME-FRAME[3] with new fault-objects <3> and <4> are created: RLF=LF ∩ ($S2.I_X$, $S1.I_X$)=(S2.I1) ∩ ($S2.I_X$), (S1.I3) ∩ ($S1.I_X$)=(S2.I1), (S1.I3).

At step 5.7 the history file is extended to include the results of TIME-FRAME[2] and the inter-time-frame process that immediately followed:
<1-1 S2.I1→S2,FP2>
<1-2 S1.I3→S2,FP2>
   <2-1 S2.I1→S2,FP3>
   <2-2 S2.I0→S1,FP1>.

The history is to be interpreted as follows: root object <1-1> can be followed by each of object <2-1> and <2-2>, and root object <1-2> can also be followed by <2-1> and <2-2>. Thus four potential solution-paths are established: <1-1><2-1>, <1-1><2-2>, <1-2><2-1>, and <1-2><2-2>. Each potential solution-path begins with a root and continues until a test is discovered or until otherwise terminated.

A solution-path which revisits a previously appearing good next-state and fault-pattern without an intervening discovery of a test has exhausted its solution space and is terminated. No new information can result from pursuing such a "looping" path as it will never terminate in the discovery of a test.

Two or more solution paths that include a member having a common fault-name, good next-state and fault-pattern can be merged into a single path, as root objects <1-1> and <1-2> above were merged because each resulted in a new fault-object having good next-state S2 and fault-pattern FP2. This is a matter of computational efficiency as both paths, if continued separately will explore the same solution space.

FIG. 12(C) illustrates TIME-FRAME[3] and is not followed by an inter-time-frame process in this simple example. Tests are discovered by the appearance of fault at the primary output line OUT at the end of TIME-FRAME[3]. A post-test-detection process used to extract test pattern sequences from the history file follows the time-frame instead.

TIME-FRAME[3] begins with the new fault-object <3 0000 1111 0000 0000> at both the PS1 and the PS2 present-state lines, and new fault-object <4 0000 0000 1111 0000> at the PS1 present-state line. The replacement local-faults for use during TIME-FRAME[3] are <3 0000 0010 0000 0000> and <4 0000 0000 1000 0000>.

The following two fault-objects appear at the primary output line OUT at the end of TIME-FRAME[3]:
<3 0000 0100 0000 0000> and <4 0000 0000 0100 0000>.

The appearance of fault at a primary output line unambiguously signals the discovery of valid test pattern sequences. No independent test validation is required.

A post-test-detection process is shown in FIG. 12(C) and includes numbered steps 12.1-12.3. At step 12.1 the fault-propagation functions of each of the fault-objects that have arrived at the primary output line OUT at the end of TIME-FRAME[3] are decomposed into component S/Is:

<3 S2.I2> and <4 S1.I2>.

At step 12.2 the history file is extended to include these results. And finally, at step 12.3 test patterns are extracted from the history file. A root object <1-1> contributes a fault-activating S/I. Intermediate objects, in this instance <2-1>, contribute additional input vectors. A final object <3> contributes a final input vector, a good next-state, and a good output level for the primary output line at which the fault-object appeared. These results are illustrated at step 12.3.

Four test pattern sequences are found. Any one of which will reveal the existence of the fault NS1/0 in a copy of the sequential circuit SMALL that includes the single stuck-at fault NS1/0.

Test pattern sequences that are generated by the single-pass methods described here begin with a fault-activating present-state/input-vector combination and end with a good next-state and good output level. Such tests can be assembled into a suite of tests with the good next-state at the end of one test being the initial present-state of a next test in the sequence. Reference is made to the '571 patent and to the '683 patent application for a further discussion of how such sequences of individual tests can be created and used.

While the invention has been described in relation to the embodiments shown in the accompanying Drawing figures, other embodiments, alternatives and modifications will be apparent to those skilled in the art. It is intended that the Specification be exemplary only, and the true scope and spirit of the invention be indicated by the following Claims.

What is claimed is:

1. A single-pass method for generating test pattern sequences for sequential circuits, comprising the steps of:
   a. receiving a model of a sequential circuit expressed as a combinational part and a feedback storage part;
   b. defining an initial time-frame using the combinational part of the received circuit model, and defining a history file;
   c. defining a local-fault for a net of the circuit model and inserting the local-fault on the net for the initial time-frame;
   d. searching the initial time-frame for circuit model present-state and primary input vectors that will activate the local-fault, and propagate the fault to circuit model next-state lines and/or to at least one circuit model primary output line;
   e. flagging the detection of a valid test pattern sequence for each fault reaching a primary output line, using the flagged detection to update the history file to indicate the successful termination of a search path, and dropping the fault from further search;
   f. decomposing a fault arriving at circuit model next-state lines into component state/input vectors;
   g. identifying each next-state line at which a specific state/input vector exists, and defining a fault-pattern to represent said lines for the specific state/input vector;
   h. mapping each state/input vector to a good next-state;
   i. forming a fault-propagation function using the good next-state and a don't-care primary input vector;
   j. constructing a new fault including the formed fault-propagation function;
   k. passing the new fault to a next time-frame by placing the new fault upon present-state lines corresponding to the fault-pattern;
   l. updating the history file by extending the search path using the new fault and its fault-pattern;
   m. inserting the local-fault at the net of the next time-frame;
   n. searching said next time-frame for good next-state and primary input vectors that will propagate the fault to next-state lines and/or at least one primary output line;
   o. continuing from step (e) until the detection of a valid test pattern sequence has been flagged for each fault or, alternatively, until otherwise terminated; then
   p. extracting the valid test pattern sequence from the history file.

2. The method of claim 1, wherein the valid test pattern sequence is used to test a sequential circuit.

3. The method of claim 1, wherein path-enabling functions identical to those used during the initial time-frame are used for all subsequent time-frames, permitting fault-propagation and path-enabling data structures during the subsequent time-frames to have size bounded by the number of state and input variables required during the initial time-frame.

4. The method of claim 1, wherein a reappearance of a fault at the circuit next-state lines and having the same fault-name, fault-propagation function, and fault-pattern as a fault during an earlier time-frame, causes further searching using the reappeared fault to be terminated.

5. The method of claim 1, wherein for time-frames following the initial time-frame, the fault-propagation function of a fault inserted at a circuit model net is represented by an intersection of a local-fault with a fault-mask.

6. A memory product that is readable by a computer and stores a computer program causing the computer to generate test pattern sequences for a sequential circuit, the computer program comprising the steps of:
   a. receiving a model of a sequential circuit expressed as a combinational part and a feedback storage part;
   b. defining an initial time-frame using the combinational part of the received circuit model, and defining a history file;
   c. defining a local-fault for a net of the circuit model and inserting the local-fault on the net for the initial time-frame;
   d. searching the initial time-frame for circuit model present-state and primary input vectors that will activate the local-fault, and propagate the fault to circuit model next-state lines and/or to at least one circuit model primary output line;
   e. flagging the detection of a valid test pattern sequence for each fault reaching a primary output line, using the flagged detection to update the history file to indicate the successful termination of a search path, and dropping the fault from further search;
   f. decomposing a fault arriving at circuit model next-state lines into component state/input vectors;
   g. identifying each next-state line at which a specific state/input vector exists, and defining a fault-pattern to represent said lines for the specific state/input vector;
   h. mapping each state/input vector to a good next-state;
   i. forming a fault-propagation function using the good next-state and a don't-care primary input vector;
   j. constructing a new fault including the formed fault-propagation function;
   k. passing the new fault to a next time-frame by placing the new fault upon present-state lines corresponding to the fault-pattern;
   l. updating the history file by extending the search path using the new fault and its fault-pattern;
   m. inserting the local-fault at the net of the next time-frame;
   n. searching said next time-frame for good next-state and primary input vectors that will propagate the fault to next-state lines and/or at least one primary output line;

o. continuing from step (e) until the detection of a valid test pattern sequence has been flagged for each fault or, alternatively, until otherwise terminated; then p extracting the valid test pattern sequence from the history file.

7. The memory product of claim 6, wherein the valid test pattern sequence is used to test a sequential circuit.

8. The memory product of claim 6, wherein path-enabling functions identical to those used during the initial time-frame are used for all subsequent time-frames, permitting fault-propagation and path-enabling data structures during the subsequent time-frames to have size bounded by the number of state and input variables required during the initial time-frame.

9. The memory product of claim 6, wherein a reappearance of a fault at the circuit next-state lines and having the same fault-name, fault-propagation function, and fault-pattern as a fault during an earlier time-frame, causes further searching using the reappeared fault to be terminated.

10. The memory product of claim 6, wherein for time-frames following the initial time-frame, the fault-propagation function of a fault inserted at a circuit model net is represented by an intersection of a local-fault with a fault-mask.

11. A single-pass method for test pattern generation for sequential circuits, comprising the steps of:
  a. Activating a local-fault in an initial time-frame, and using local-fault to represent a copy of fault in each subsequent time-frame;
  b. Propagating fault within each time-frame in an attempt to reach primary output and next-state lines;
  c. Mapping faults reaching next-state lines to good next-states, and determining their fault-patterns;
  d. Passing mapped faults to a next time-frame according to the fault-patterns;
  e. Maintaining a history file of the mappings; and
  f. Using the history file to construct test-pattern sequences for each fault reaching a primary output line.

12. The method of claim 11, further comprising using a constructed test-pattern sequence to test a sequential circuit.

13. The method of claim 11, wherein the fault propagating includes activated faults and faults passed from an immediately preceding time-frame.

14. The method of claim 13, wherein the mapping and determining step further comprises a fault-propagation function of each fault reaching a next-state line being decomposed into discrete S/Is, each resulting S/I being mapped to a good next-state, and a fault-pattern being determined for each resulting S/I.

15. The method of claim 14, further comprising gathering all faults having a common fault-name, common good next-state, and sharing a common fault-pattern into a group, and creating a new fault-object having a fault-propagation function comprising a concatenation of the common good next-state and a don't-care input vector, and using the new fault-object as the mapped fault for passing to a next time-frame by placing the new fault-object onto present-state lines for the next time-frame according to the shared fault-pattern.

16. The method of claim 15, wherein the maintaining a history file step further comprises creating and maintaining a history of decomposed S/Is and the groups into which they are gathered.

17. The method of claim 15, wherein a reappearance of a propagated fault at the next-state lines and having the same fault-name, fault-propagation function, and fault-pattern as a propagated fault during an earlier time-frame, causes further searching using the reappeared propagated fault to be terminated.

18. The method of claim 11, wherein a search for test-pattern sequences continues from one time-frame to a next until a fault reaches a primary output line or, alternatively, until otherwise terminated.

19. The method of claim 11, wherein the copy of fault at each subsequent time-frame has a fault-propagation function that is an intersection of a fault-mask and the fault-propagation function of local-fault.

20. The method of claim 11, wherein path-enabling functions identical to those used during the initial time-frame are used for all subsequent time-frames, permitting fault-propagation and path-enabling data structures used during the subsequent time-frames to have a size bounded by a number of state and input variables required during the initial time-frame.

* * * * *